(12) United States Patent
Varnica et al.

(10) Patent No.: US 8,438,461 B2
(45) Date of Patent: May 7, 2013

(54) POWER CONSUMPTION IN LDPC DECODER FOR LOW-POWER APPLICATIONS

(75) Inventors: Nedeljko Varnica, Sunnyvale, CA (US); Gregory Burd, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 367 days.

(21) Appl. No.: 12/892,183

(22) Filed: Sep. 28, 2010

(65) Prior Publication Data

US 2011/0087933 A1   Apr. 14, 2011

Related U.S. Application Data

(60) Provisional application No. 61/250,821, filed on Oct. 12, 2009.

(51) Int. Cl.
*H03M 13/00* (2006.01)

(52) U.S. Cl.
USPC .......................................... 714/785; 714/774

(58) Field of Classification Search .................. 714/785, 714/774
See application file for complete search history.

(56) References Cited

U.S. PATENT DOCUMENTS

| | | | | |
|---|---|---|---|---|
| 6,671,284 B1 * | 12/2003 | Yonge et al. | | 370/462 |
| 6,851,083 B1 * | 2/2005 | Hagenauer et al. | | 714/774 |
| 2009/0217138 A1 * | 8/2009 | Touzni et al. | | 714/776 |

* cited by examiner

*Primary Examiner* — M. Mujtaba K Chaudry

(57) ABSTRACT

This disclosure relates generally to low power data decoding, and more particularly to low power iterative decoders for data encoded with a low-density parity check (LDPC) encoder. Systems and methods are disclosed in which a low-power syndrome check may be performed in the first iteration or part of the first iteration during the process of decoding a LDPC code in an LDPC decoder. Systems and methods are also disclosed in which a control over the precision of messages sent or received and/or a change in the scaling of these messages may be implemented in the LDPC decoder. The low-power techniques described herein may reduce power consumption without a substantial decrease in performance of the applications that make use of LDPC codes or the devices that make use of low-power LDPC decoders.

20 Claims, 9 Drawing Sheets

POWER CONSUMPTION IN LDPC DECODER FOR LOW-POWER APPLICATIONS

CROSS-REFERENCE TO RELATED APPLICATIONS

This claims the benefit under 35 U.S.C. §119(e) of U.S. Provisional Application No. 61/250,821, filed Oct. 12, 2009, the contents of which is hereby incorporated by reference herein in its entirety.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

This disclosure relates generally to low power data decoding, and more particularly to low power iterative decoders for data encoded with a low-density parity check (LDPC) encoder.

LDPC codes may be used for effectively correcting errors in information transmitted in a noisy communications channel. The information may be encoded (by a LDPC encoder) prior to transmission and then subsequently decoded (by a LDPC decoder) when received.

LDPC codes may be defined by one of many different types of parity check matrices. The structure of an LDPC code's parity check matrix may be, for example, random, cyclic, or quasi-cyclic. A LDPC decoder (e.g., a flooding decoder) may decode LDPC codes using an iterative message passing algorithm (flooding decoding), such as a min-sum decoding algorithm. Such algorithms may decode a received codeword using an iterative process in which each iteration includes two update steps involving check nodes and variable nodes passing messages to one another. Another LDPC decoder (e.g., a layered decoder) may use a layered approach to decoding (layered decoding) to decode LDPC codes. Both layered and flooding decoding approaches involve messages being updated and stored. As used herein, the term message refers to a numerical value, usually representing a log likelihood ratio (LLR) calculated based on the information (e.g., a vector) received from a communications channel by an LDPC decoder. LDPC codes and decoders that are used to decode LDPC codes may be use in numerous applications and devices. For example, data storage, satellite communications, wireless communications, wire-line communications, and power-line communications are applications that may each require the use of LDPC codes and LDPC decoders. Devices such as digital camera flash memory storage, satellites, mobile phones, and other mobile devices may each require the use of LDPC codes and LDPC decoders.

Due to the widespread use of LDPC codes in numerous applications and devices, traditional LDPC decoders that operate without a low power consumption may disadvantageously consume a large amount of power at a high rate. For example, traditional LDPC decoders that have a high rate of power consumption may cause the batteries of a mobile device to be drained at a substantially high rate.

SUMMARY OF THE DISCLOSURE

In accordance with the principles of the present disclosure, methods and apparatus are provided for low-power LDPC decoders that do not cause a substantial decrease in performance. Such methods and apparatus can be used in order to prolong the battery life of the mobile devices. LDPC decoders are disclosed that implement low-power techniques to reduce the power consumed in the process of decoding LDPC codes. The low-power techniques described herein may reduce power consumption without a substantial decrease in performance of the applications that make use of LDPC codes or the devices that make use of low-power LDPC decoders.

In some embodiments, the condition of a channel (e.g., from which a decoder receives information) and/or a device using the decoder may be monitored (e.g., using monitoring circuitry). A metric value may be determined based on the condition of the channel and/or the device (e.g., using monitoring circuitry). For example, the number of errors corrected in past received vectors by a LDPC decoder employing an LDPC decoding process and/or the number of past iterations necessary for decoding may be used to determine the condition of the communications channel. The metric value may be compared with at least one threshold (e.g., using monitoring circuitry). The comparison may be used to determine whether to enable or disable the low-power syndrome check (and/or normal processing of the vector). Based on the comparison indicating the condition, normal decoder processing of the received vector may be disabled, a syndrome may be pre-computed based on an initial message derived from the received vector, and a determination of the validity of the received vector may be made based on the pre-computed syndrome.

In some embodiments, the pre-computed syndrome may allow the LDPC decoder to quickly determine if the received vector is a valid codeword, e.g. during circumstances in which the condition of the communication channel or the device is good. This check may therefore reduce power consumption. The low-power syndrome check may reduce unnecessary power consumption from multiple unnecessary iterations of the decoder, e.g., when there is little noise present in the communications channel and few errors have been corrected by the decoder in past received vectors.

In some embodiments, the condition of a channel (e.g., from which a decoder receives information) and/or a device using the decoder may be monitored (e.g., using monitoring circuitry). A metric value may be determined based on the condition of the channel and/or the device (e.g., using monitoring circuitry). The metric value may be compared with at least one threshold (e.g., using monitoring circuitry). The comparison may be used to determine the appropriate values for the precision and/or scale factor of messages processed by the decoder. The bit precision and/or scale factor may be set according to this determined value.

In some embodiments, the bit precision of the decoder may be reduced when there is little noise present in the communications channel and few errors have been corrected by the decoder in past received vectors (i.e., when the condition of the communications channel is good). A reduction in the precision of the messages and/or an increase in the scaling factor used for the messages may advantageously reduce power consumption in the decoder (e.g., a LDPC decoder) due to the reduction in the complexity of computations necessary in the decoder during processing.

The following description of embodiments of the present disclosure provides illustration and description, but is not intended to be exhaustive or to limit the disclosure to the precise form disclosed. Modifications and variations are possible in light of the above teachings or may be acquired from practice of what is disclosed herein. For example, while an LDPC decoder is described with relation to FIGS. 1-9, below, this element may be replaced by any type of decoder (e.g., a Turbo Code decoder, a layered decoder, or a flooding decoder). The decoder may make use of either hard information (e.g., using a hard decoder such as a bit-flipping decoder) or soft information (e.g., using an iterative soft decoder) to decode incoming information. While certain components of the present disclosure have been described as implemented in hardware and others in software, other configurations may be possible.

BRIEF DESCRIPTION OF THE FIGURES

The above and other aspects and advantages of the present disclosure will be apparent upon consideration of the following detailed description, taken in conjunction with the accompanying drawings, in which like reference characters refer to like parts throughout, and in which.

DETAILED DESCRIPTION OF THE DISCLOSURE

Systems and methods are provided for reducing the power consumed by LDPC decoders while substantially maintaining the performance of the decoders. In applications and devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
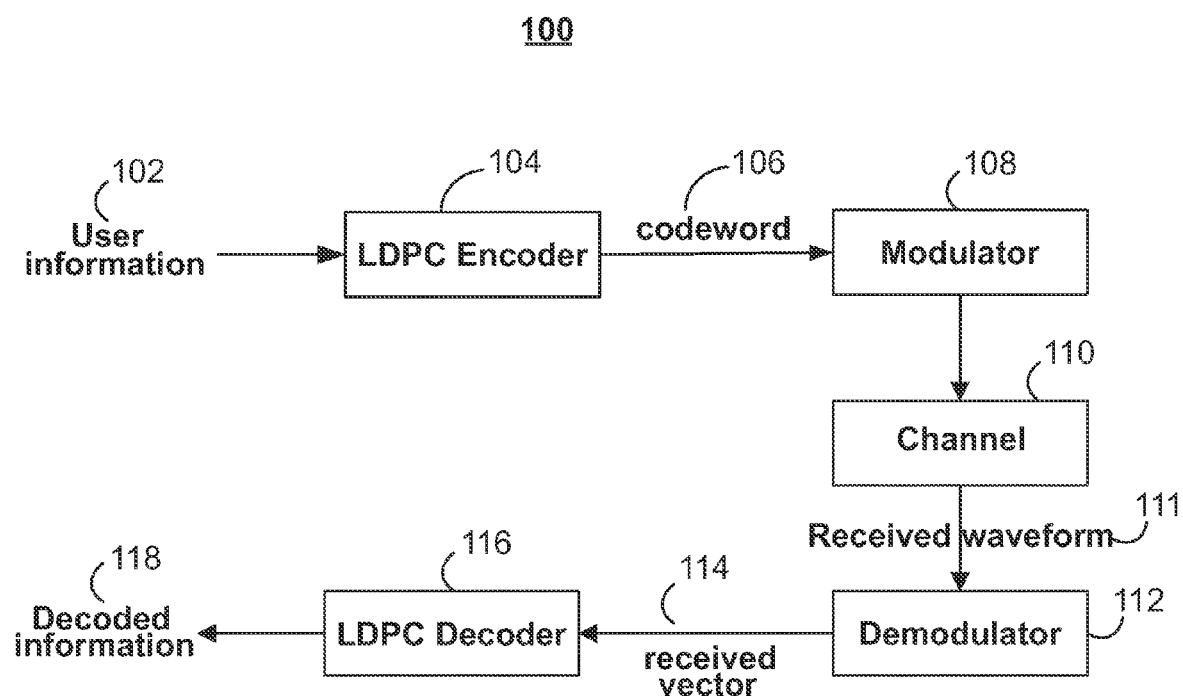
FIG. 1 shows an illustrative block diagram of an error-correcting communication/storage system in accordance with some embodiments.

FIG. 1 shows an illustrative communication or data storage system 100 that utilizes error-correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present disclosure will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length that may be referred to as n, where n≧k.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 represents media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114 and this result may contain errors due to channel corruption.

Received vector 114 may then be processed by LDPC decoder 116. LDPC decoder 116 may be located inside of any device. For example, LDPC decoder 116 may be located inside of a flash memory storage, a mobile device, a phone, or a satellite. LDPC decoder 116 may have low-power circuitry and monitoring circuitry to facilitate a substantial reduction in power-consumption in the LDPC decoder. LDPC decoder 116 is used to correct or detect errors in received vector 114. LDPC decoder 116 uses an iterative message-passing algorithm (e.g. flooding decoding or layered decoding) to correct or detect errors in received vector 114. LDPC decoder 116 calculates or receives an initial log-likelihood-ratio (LLR) message that represents a bit reliability metric for the bits of received vector 114. For example, LDPC decoder 116 computes a LLR message using the equation $$LLR(b_i) = \log\left(\frac{P(b_i = 0)}{P(b_i = 1)}\right)$$

for each i, where $b_i$ may represent the $i^{th}$ bit in received vector 114. A LLR for each bit that is greater than zero may indicate that a bit value of zero is more likely, while a LLR that is less than zero may indicate that a one bit value of one is more likely. LDPC decoder 116 may use the computed LLR messages in the message passing algorithm. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit that is any suitable predetermined number. When LDPC decoder 116 reaches the maximum iteration limit, (i.e., a positive integer, maxIterNum), LDPC decoder 116 may automatically terminate operation and do some post-processing of the received vector or move on to the next received vector 114. However, if the output of LDPC decoder 116 successfully converges to a valid codeword, LDPC decoder 116 may then output decoded information 118.

Figure 2:
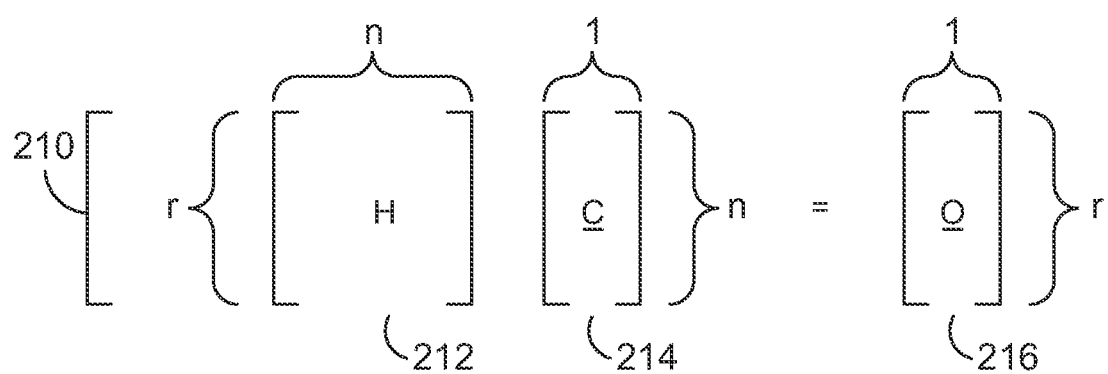
FIG. 2 shows an illustrative example of the properties of a codeword in accordance with some embodiments.

FIG. 2 shows an illustrative example of the properties of codeword 106 of FIG. 1 in accordance with some embodiments. The LDPC codes processed by encoder 104 of FIG. 1 and LDPC decoder 116 of FIG. 1 are conventionally represented by mathematical vector models. In particular, an LDPC code is described by its parity check matrix H. Equation 210 illustrates parity check matrix 212. Parity check matrix 212 is of size [r×n], corresponding to codewords of length n and syndromes of length r. Codewords may be, for example, n-length codeword 106 or n-length received vector 114 of FIG. 1. Syndrome length r satisfies the inequality r≧n−k and where k is the length of the information being encoded (e.g., length of user information 102 of FIG. 1). Each bit of codeword 114 corresponds to a column of parity check matrix 212. When parity check matrix 212 is multiplied by codeword 214, the result is syndrome 216. Syndrome 216 is a zero-vector of size [r×1] where all elements equal zero. When syndrome 216 is equal to a zero-vector, codeword 214 is determined to be a valid codeword. When syndrome 216 is not equal to a zero-vector, codeword 214 is determined to be an invalid codeword. Parity check matrix 212 has a column weight ("cw") defined to be the maximum of the set of the number of nonzero entries in each column of parity check matrix 212. Parity check matrix 212 is not unique, and may be chosen, for example, to be computationally convenient and/or to decrease the number of errors generated by the message passing algorithm in LDPC decoder 116. As discussed in relation to FIG. 1, codeword 214 may be decoded in LDPC decoder 116 to produce decoded information 118. In practice, quasi-cyclic LDPC code matrices are often used as such codes are very suitable for hardware implementations.

Figure 3:
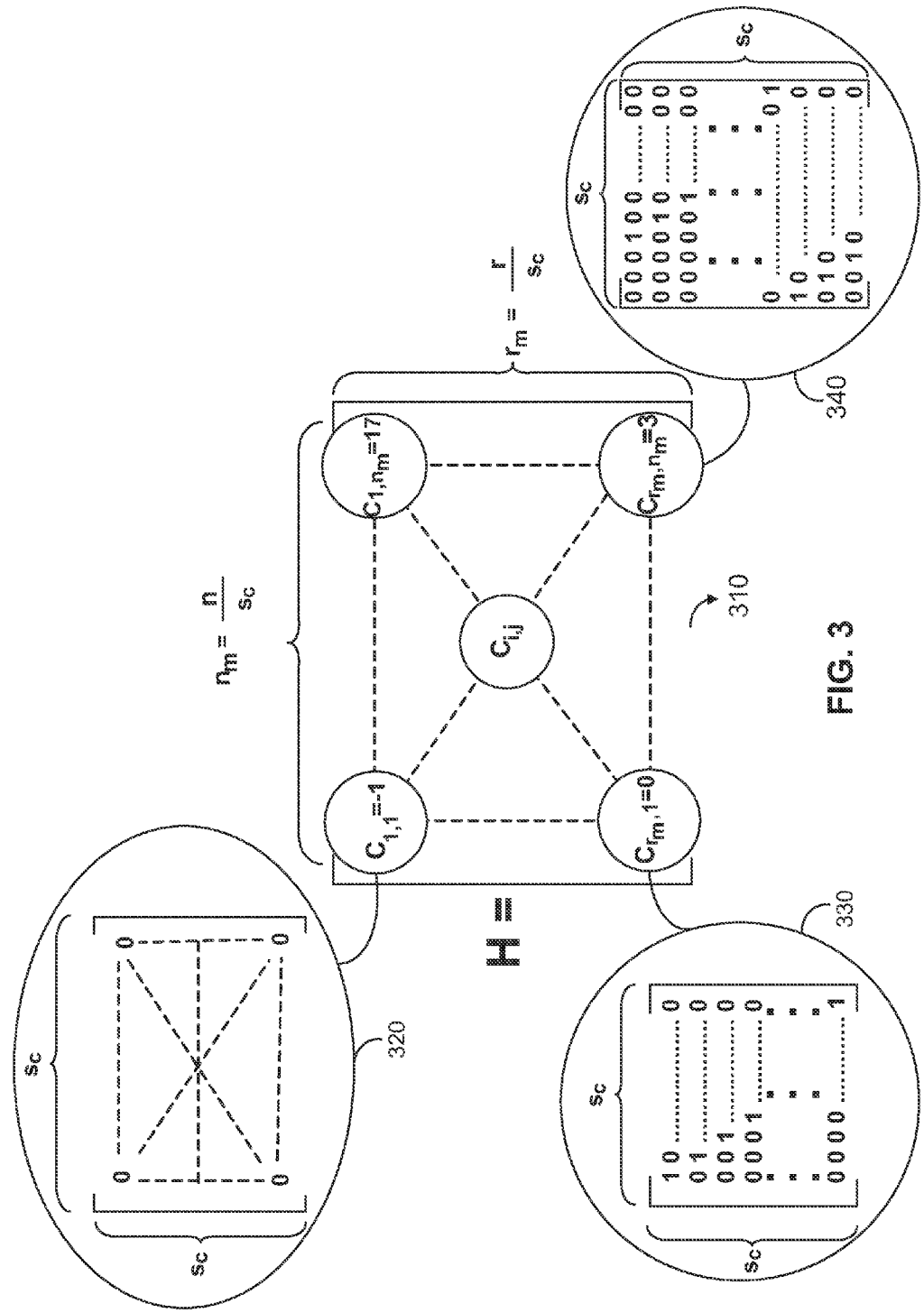
FIG. 3 shows an illustrative example of a quasi-cyclic parity check matrix in a mother matrix representation in accordance with some embodiments.

FIG. 3 shows an illustrative example of quasi-cyclic parity check matrix 310 in a mother matrix representation in accordance with some embodiments. A mother matrix representation is a compact way for describing a matrix that may contain a large number of elements. The mother matrix representation is equivalent to the normal matrix representation, but may be advantageous in illustrating the structure of a possibly large matrix without the necessity of explicitly listing each element in the matrix.

A quasi-cyclic code representation is defined by the characteristic that the parity check matrix for that particular code is quasi-cyclic. A quasi-cyclic parity check matrix in a mother matrix representation is made up of circular submatrices known as circulants. Circulant 340 is one such matrix. Circulant 340 is a square matrix—i.e. circulant 340 has the same number of rows as columns. This number is commonly referred to as the circulant size $S_c$. In addition, circulants have the property that for any given positive integer $C_{i,j} < S_c$, any row/column of the circulant matrix may be cyclically shifted by $C_{i,j}$ positions to obtain another row/column. For example, the number zero represents identity matrix 330 of size $S_c$. The number three represents matrix 340 that is equal to identity matrix 330 with each row cyclically shifted to the right by three positions. As a matter of notation, minus-one denotes the all-zero matrix 320. For brevity, the phrase "non-zero circulant" will be used to refer any circulant matrix that is not the all-zero matrix. Recall that parity check matrix 310 is of size [r×n]. Thus, the size of the mother matrix is $[r_m = r/S_c \times n_m = n/S_c]$, where $S_c$, r, and n are chosen so that $r_m$ and $n_m$ are integers.

Figure 4:
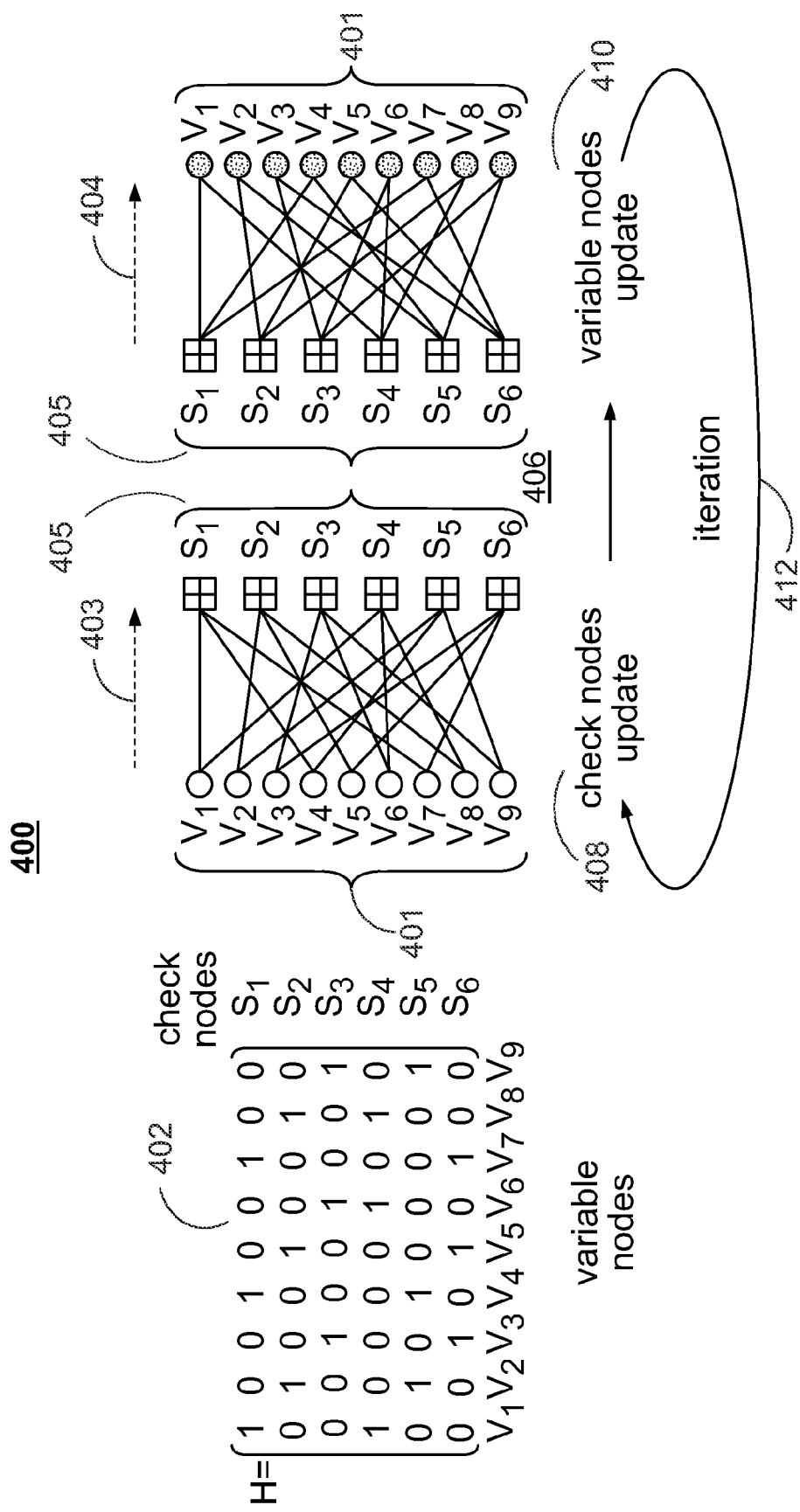
FIG. 4 shows a graphical illustration of a parity check matrix and the iterative message passing algorithm implemented in a flooding decoder in accordance with some embodiments.

FIG. 4 shows graphical illustration 400 of a parity check matrix and the iterative message passing algorithm implemented in a flooding decoder in accordance with some embodiments. An LDPC code may be graphically represented by a Tanner graph, a bipartite graph showing the relationship between a LDPC code's codeword bits and parity check equations. The advantages of using a Tanner graph of a LDPC code may include access to efficient graph-based message-passing algorithms for decoding. There are two types of nodes shown in Tanner graphs 403 and 404. Variable nodes 401 represent each position in codeword 106 and are denoted by circles. Thus, there may be n variable nodes. Variable nodes may also be referred to as symbol or bit nodes. Check nodes 405 may represent each syndrome (parity check equation) of LDPC code. For example, there may be n−k check nodes. Check nodes are denoted by squares.

Tanner graphs 403 and 404 correspond to parity check matrix 402. The check nodes and variable nodes of Tanner graphs 403 and 404 correspond to the rows and columns of parity check matrix 402, respectively. The undirected edges connecting check nodes with variable nodes correspond to the locations of the non-zero entries of parity check matrix 402. In other words, parity check matrix 402 is the adjacency matrix of Tanner graphs 403 and 404. For example, the 1 at the (1,1) location and the 0 at the (1,2) location of parity check matrix 402 may indicate that there is an edge between check node $S_1$ and variable node $V_1$, and that there is no edge between check node $S_1$ and variable node $V_2$, respectively. Therefore, if there are $d_v$ "1"s in a given column of parity check matrix 402, then there are $d_v$ edges emanating from the variable node corresponding to that column. Equivalently, the variable node corresponding to that column has a degree of $d_v$. Similarly, if there are $d_c$ "1"s in some given row of parity check matrix 402, then there may be $d_c$ edges emanating from the check node corresponding to that row. Equivalently, the check node corresponding to that row has a degree of $d_c$.

The check nodes (e.g. check nodes 405) of a Tanner graph may either be satisfied or unsatisfied, where a satisfied node has a binary value of 0 and an unsatisfied node has a binary value of 1. The value of each check node may be equal to the sum modulo two of the values of the variable nodes to which it is connected. A check node is satisfied (i.e., equal to 0), if the values of the variable nodes connected to the check node sum to an even number and otherwise it is unsatisfied. For example, check node $S_2$ of Tanner graphs 403 and 404 may be satisfied if the values of variable nodes $V_2$, $V_5$, and $V_8$ sum to an even number. Furthermore, when a check node is unsatisfied and the values of the variable nodes to which it is connected do not sum to zero, at least one of the variable nodes connected to it may be in error. Thus, the value of the check nodes (or equivalently, the value of the syndrome produced by parity check matrix 402) may provide a parity check on each codeword received by a LDPC decoder (i.e., LDPC decoder 116 of FIG. 1), thereby providing error correction capability to communication/storage system 100 of FIG. 1.

Tanner graphs 403 and 404 may be used to illustrate an iterative two-step decoding algorithm known as message passing algorithm 406. Message passing algorithm 406 may be employed by, LDPC decoder 116 of FIG. 1 or any variant of this decoder (e.g., a flooding decoder, or a layered decoder). The message passing algorithm performs several rounds (or iterations) 412 of message updates in accordance with the structure of the Tanner graph associated with the parity check matrix of the LDPC codes to be decoded.

Iteration 412 may be repeated until either the codeword has been decoded or until a threshold number of iterations has been reached. The messages that are sent during each step of each iteration of message passing algorithm 406 may depend on the update rules and the scheduling of the update steps.

Prior to the first iteration of message passing algorithm 406, each of the variable nodes 401 of FIG. 4 receive an initial LLR message based on information derived from received vector 114 in FIG. 1. As will be discussed below, a low-power syndrome check may be performed, in some cases, prior to or during the first iteration of message passing algorithm 406. Each iteration of message passing algorithm 406 may include two steps. In the first step, check nodes may update and in the second step variable nodes may update. This process may be repeated until either the codeword has been decoded or until a threshold number of iterations (e.g., maxIterNum) has been reached.

For example, in the first step, a group of variable nodes within the set of variable nodes 401 send their current messages to a group of check nodes (e.g. to be processed in the first layer of message passing decoding) within the set of check nodes 405 to which they are connected. The group of check nodes then perform update 408 by carrying out computations based on the messages that they receive and a set of update rules. These check nodes receive, e.g., $d_c$ messages each from a different variable node to which it is connected. Each message sent from the group of variable nodes to the group of check nodes may be labeled as a Q type message. Each a-posteriori probability (APP) message computed for the group of variable nodes may be labeled as P type message. Q type or P type messages may be stored in the LDPC-decoder's memory.

For example, these messages can be labeled $Q_1$ through $Q_{d_c}$. The group of check nodes may then update by computing a R type message using each Q type message it received and a min approximation. Specifically, using all of the Q type messages it received, each of the check nodes in the group of check nodes may compute a R type message based on the equations $$\tanh\left(\frac{R}{2}\right) = \prod_{k=1}^{d_c-1} \tanh\left(\frac{Q_k}{2}\right).$$

This equation can be approximated using min approximation $$R \approx ScaleR \times \min(Q_1, \ldots, Q_{d_c-1}) \prod_{k=1}^{d_c-1} \text{sign}(Q_k).$$

In this equation, ScaleR represents a scale factor (which may be set to 1 or any other value) that multiplies the R type message to improve the performance of the LDPC decoder applying this min-sum technique. The scale factor may allow the performance of the decoder to approach that of one applying a sum-product technique (that does not use a min approximation). The $Q_k$ messages (i.e. a number k of Q type messages) may be read directly from the memory of the decoder or may be reconstructed. The $Q_k$ messages may be reconstructed from the $P_k$ messages (i.e. a number k of P type messages) and the previous R type messages that may be read from the memory of the LDPC decoder. These newly computed R messages are sent to each of the variable nodes to which the check node is connected.

For example, in the second step, a group of check nodes within the set of check nodes 405 sends their current message to a group of variable nodes within the set of variable nodes 401 to which they are connected. The group of variable nodes then performs update 410 by carrying out computations based on the messages that they receive and a set of update rules. These variable nodes receive, e.g., $d_v$ messages each from different check nodes to which it is connected. Each message sent from the group of check nodes to the group of variable nodes may be labeled as a R type message. For example, the messages sent from check nodes to a variable node can be labeled $R_1$ through $R_{d_v}$. The group of variable nodes may then update by computing a Q type message using each R type message it received. Specifically, using the initially received LLR message, and each of the R type messages received, each variable node of the group of variable nodes may compute a Q type message based on the equation $$Q = ScaleQ \times \left(LLR + \sum_{j=1}^{d_v-1} R_j\right).$$

In this equation, ScaleQ may represent a scale factor (that may be set to 1 or any other value) that multiplies the Q type message to improve the performance of the LDPC decoder. In some cases, both R and Q type messages may be "scaled" by the multiplication of each by ScaleR and ScaleQ, respectively. Similarly, message update steps may be performed to compute a P type message (also known as an a-posteriori probability (APP) message). Using the initial LLR message and each of the R type messages received, each variable node of the group of variable nodes may compute a P type message 515 based on the equation:

$$P = LLR + \sum_{j=1}^{d_v} R_j.$$

The sign of P message is often called hard decision (HD) message of LDPC decoder. For example, if the value of APP-message P on variable node j is greater than zero, then the HD for variable node j is set to 0. If the value of APP-message P on variable node j is less than zero, then the HD for variable node j is set to 1. In addition, each variable node of the group of variable nodes may also compute an extrinsic ($LLR_{EXT}$) message based on the equations:

$$LLR_{APP}(v) = LLR + \sum_{j=1}^{d_v} R_j$$

and $LLR_{EXT}(v)=LLR_{APP}(v)-LLR$. Some or all of these newly computed messages may be sent to each of the check nodes to which the variable node is connected.

Figure 5:
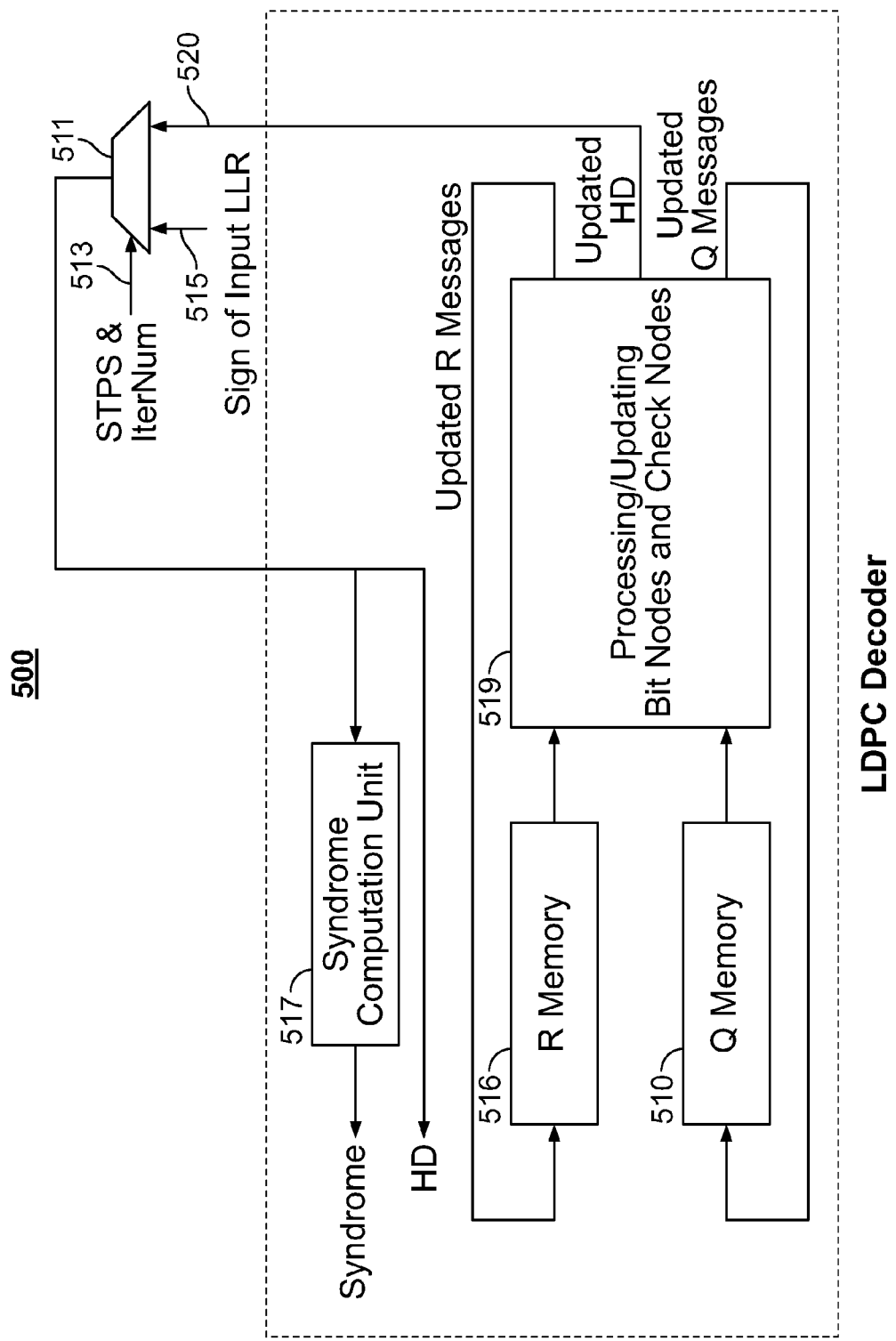
FIG. 5 shows a simplified block diagram of a layered LDPC decoder with low-power circuitry in accordance with some embodiments.

FIG. 5 shows a simplified block diagram of layered LDPC decoder 500 (e.g., a layered variant of LDPC decoder 116 of FIG. 1) with low-power circuitry in accordance with some embodiments. LDPC decoder 500 includes Q memory 510, R memory 516, syndrome computation unit 517, processing/update block 519, multiplexer 511 and additional components used to decode a received vector (e.g. received vector 114 of FIG. 1), and memory to store other types of messages or information (e.g., hard decisions). Multiplexer 511 includes Switch-To-Power-Save (STPS) select input 513 (equivalently, STPS switch) as well as inputs 515 and 520. Low-power circuitry in layered LDPC decoder 500 or any other decoder may include any of these components. For example, the low-power circuitry may include multiplexer 511, syndrome computation unit 517, convergence logic (not shown), or similar components.

Q-memory 510 and R-memory 516 store variable-to-check (bit-to-check) messages (Q-type messages) and check-to-variable (check-to-bit) messages (R type messages), respectively. As an example, R memory 516 may store data used for compact storage of R type messages (e.g. Min1, Min2, Min1Index, Min2Index, AccumulatedSign). This memory can be used to derive R-type messages.

During the process of decoding a LDPC code in layered LDPC decoder 500, multiplexer 511 allows for a choice between performing a low-power syndrome check in the first iteration or part of the first iteration or normal decoding without a low-power syndrome check. The low-power syndrome check may allow the LDPC decoder to quickly determine if the received vector is a valid codeword when, e.g., the condition of the communication channel (e.g., channel 110 of FIG. 1) is good. A power-savings can therefore be realized by the decoder from not having to process the received vector any further. For example, if the signal-to-noise ratio (SNR) of the communications channel is high, then the condition of the communications channel is good, and the low-power syndrome check may be enabled. A power saving may be realized as a result of the low-power syndrome check being enabled. If however, the SNR of the communications channel is low, then the condition of the communications channel is bad, and the low-power syndrome check may be disabled. The signal to noise ratio may be determined by, for example, using monitoring logic circuitry as described below, and/or by any channel monitoring circuitry internal or external to decoder 500.

Multiplexer 511 includes STPS select input 513 as well as inputs 515 and 520. STPS select input 513 allows multiplexer 511 to choose either input 515 or input 520 to be output to syndrome computation unit 517.

If STPS select input 513 of multiplexer 511 is equal to one, then the low-power syndrome check is enabled. Multiplexer 511 then chooses input 515 (the sign of the initial LLR message received or computed by the decoder) to be output to syndrome computation unit 517. STPS select input 513 (equivalently STPS switch 513) may be used to substantially stop normal decoder processing, e.g., when the input is set to one and when the low-power syndrome check is enabled. When the low-power syndrome check is enabled, normal LDPC decoder processing (e.g., reading and writing to R memory 516, reading and writing to Q memory 510, etc.) of the received vector is not performed. Because normal LDPC decoder processing is not performed at that time, power consumption from decoder components that would otherwise be used during normal processing may be minimized. Therefore, the overall power-consumption of a device in which the decoder is located or used may be substantially reduced.

If STPS select input 513 of multiplexer 511 is equal to zero, then the low-power syndrome check is disabled. Multiplexer 511 then chooses input 520 (a hard decoded (HD) data from the LDPC decoder, which is equal to the sign of the APP (P type) message in LDPC decoder) to be output to syndrome computation unit 517. When the low-power syndrome check is disabled, normal LDPC decoder processing of the received vector is performed. Normal decoder processing, as described below, may also be performed if the low-power syndrome check does not determine that the received vector is a valid codeword. These two modes of operation (enabled and disabled low-power syndrome check) of the LDPC decoder will be described in greater detail below.

During normal decoder processing (i.e., with the low-power syndrome check disabled), STPS select input 513 of multiplexer 511 is equal to zero. LDPC decoder 500 may operate using a decoding approach as described in FIG. 4. As discussed above, an initial LLR message, based on information from the received vector (e.g., received vector 114 of FIG. 1) is computed or received by the LDPC decoder (e.g., layered LDPC decoder 500). Initially, the variable node (equivalently, bit node) messages in decoder (Q-type messages) may be equal to the initial LLR messages computed or received. Processing/update block 519 may read R type messages from R memory 516 and/or Q type messages from Q memory 510 and may process and update these messages (e.g., using the equations described above). Processing/update block 519 may store the updated R type messages to R memory 516 and/or the update Q type messages to Q memory 510. Processing/update block 519 may also output updated HD data to the input 520 of multiplexer 511.

The syndrome computation unit 517 computes a syndrome (e.g., similar to syndrome 216 of FIG. 2) based on the messages it receives at its input and the parity check matrix associated with the LDPC code being applied. Syndrome computation unit 517 may pass the computed syndrome to a convergence logic (not shown) and/or to a hard decision memory (also not shown). The convergence logic may determine that the received vector is valid based on the syndromes it receives. For example, if the syndromes calculated are all zero, then the convergence logic may determine that the received vector is a valid codeword and may terminate any further processing of the receive vector by LDPC decoder 500. If, however, the sign of any one syndrome calculated based on the initial LLR message is non-zero, then the convergence logic may determine that the received vector is an invalid codeword and may allow further processing of the received vector by LDPC decoder 500 (i.e., additional iterations). The iterations may continue until the LDPC decoder converges to a valid codeword or until the maximum iteration limit (i.e., a positive integer, maxIterNum) is reached, whichever comes first.

During low-power decoder processing (i.e., with the low-power syndrome check enabled), STPS select input 513 of multiplexer 511 is equal to one. As discussed above, an initial LLR message, based on information from the received vector (e.g., received vector 114 of FIG. 1) is computed or received by the LDPC decoder (e.g., layered LDPC decoder 500). The sign of each value in the initial LLR message may be computed. For example, the sign may be equal to zero if the $i^{th}$ value in the initial LLR message indicates that the probability of $i^{th}$ bit in the received vector being "0" is greater than or equal to the probability of it being "1." For example, the sign may be equal to one if the $i^{th}$ value in the initial LLR message indicates that the probability of $i^{th}$ bit in the received vector being "1" is greater than the probability of it being "0." Input 515 to multiplexer 511 is the sign of each value in the initial LLR message. Since STPS select input 513 is equal to one, the sign of each value in the initial LLR message is chosen by multiplexer 511 to be output to syndrome computation unit 517. Any other processing of the received vector (e.g., reading/writing R memory 516 and reading/writing Q memory 510 etc) may not be performed.

Syndrome computation unit 517 computes syndromes based on the sign of each value in the initial LLR message that it receives at its input and the parity check matrix (e.g., parity check matrix 212 of FIG. 2) associated with the LDPC code being applied. Syndrome computation unit 517 may pass the computed syndromes to a convergence logic (not shown) and/or to a hard decision memory (also not shown). The convergence logic may determine that the received vector is valid based on the syndromes it receives. For example, if the syndromes calculated are all zero, then the convergence logic may determine that the received vector is a valid codeword and may terminate any further processing of the receive vector by LDPC decoder 500. If, however, the sign of any one syndrome calculated based on the initial LLR message is non-zero, then the convergence logic may determine that the received vector is an invalid codeword and may allow further processing (normal decoder processing, described above) of the received vector by layered LDPC decoder 500. During layered decoding, the convergence logic may determine that the received vector is invalid after processing any layer associated with a non-zero syndrome. The low-power syndrome check may then be stopped and LDPC decoder 500 may continue with normal decoder processing, described above.

The condition of the communications channel (e.g., channel 110 of FIG. 1) and/or the device using the LDPC decoder may be monitored (e.g., by monitoring logic circuitry, discussed below). The monitoring may determine whether to enable or disable the low-power syndrome check (i.e., to set STPS select input 513 to be one or zero, respectively). For example, when the signal-to-noise ratio (SNR) associated with the communications channel is high, indicating that the channel condition is good, STPS select input 513 is set to one, which enables the low-power syndrome check. When the SNR associated with the communications channel is low, indicating that the channel condition is bad, STPS select input 513 is set to zero, which disables the low-power syndrome check. The control of STPS select input 513 of multiplexer 511 by monitoring logic circuitry will be discussed in greater detail, below, with reference to FIG. 7.

The determination of whether the SNR value is high or low, as discussed in this disclosure, may be made based on thresholds, based on a range of values, or using other techniques. For example, a high SNR value may be one that is in the range of SNR values above or within the waterfall or the error floor region of a LDPC code's performance curve. A low SNR value may be one that is in the range of SNR values within or below the waterfall region of the LDPC code's performance curve. As another example, a SNR value greater than a first threshold (e.g., set at, for example, any value above, 0.05 dB) may be a high SNR value. A SNR value less than a second threshold (e.g., set at, for example, any value below, 5 dB) may be a low SNR value. As will be discussed below, the determination of whether the SNR value is high or low and/or the condition of the communications channel may be based on the past number of iterations taken to decode a codeword and/or the number of errors corrected by the decoder while decoding a codeword, and one or more thresholds.

When the low-power syndrome check is enabled, the check will take at most one extra LDPC decoder iteration. For a layered decoder, the low-power syndrome check may only take a part (fraction) of an iteration because the check may be stopped when the first layer associated with a non-zero syndrome is found. This may typically occur early in during the check. For example, the check may be stopped after only one or two layers when the channel SNR is low. As another example, if the channel SNR is high, the check may be stopped after approximately one-third of an iteration or one-fourth of an iteration, if the LDPC parity check matrix has column weight, cw, equal to 3 or 4, respectively. Therefore, when the low-power syndrome check is enabled, either one iteration of the decoder will be spent to determine that the received vector is a valid codeword or a fraction of an iteration will be spent to determine that this vector is not a valid codeword and further processing will be required. During good channel conditions, the low-power syndrome check will therefore substantially reduce power-consumption in the decoder by limiting unnecessary decoder processing.

While the foregoing describes the use of a layered LDPC decoder, this element may be replaced by any type of decoder (e.g., the LDPC decoder could instead or more particularly be any type of layered decoder, any type of flooding decoder, or any other type of decoder). The decoder may also be any variant of these decoders (e.g., a hard decoder, a bit-flipping decoder, a soft decoder, or any other variant of a decoder). Additionally, the decoder may make use of either hard information or soft information to decode received vectors.

Figure 6:
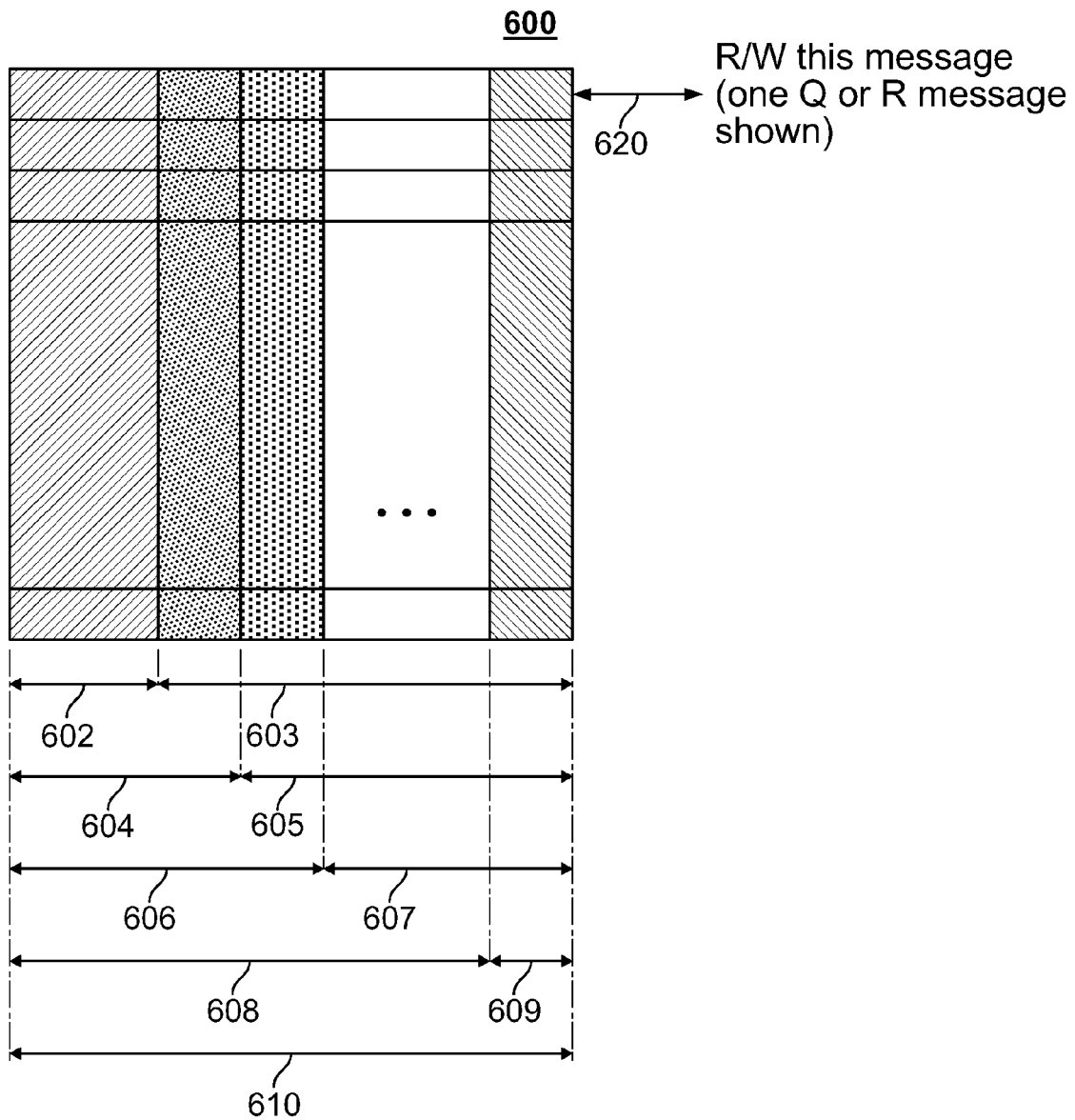
FIG. 6 shows a message memory block that may be used for changing the precision of messages to reduce power-consumption in accordance with some embodiments.

FIG. 6 shows message memory block 600 that may be used for changing the bit precision of messages to reduce power-consumption in accordance with some embodiments. Message memory block 600 may store each R and/or Q type message using a fixed number of bits, of which some bits are active and some are not active. Message memory block 600 may include any number of active bits. For example message memory block 600 may include active bits 602, 606, 608, or 610. Message memory block 600 may include masked bits 603, 605, 607, or 609. Message memory block 600 may also include memory access line 620. Message memory block 600 may represent a portion of Q memory (e.g., Q memory 510 of FIG. 5) and/or R memory (e.g., R memory 516 of FIG. 5) in a LDPC decoder. Message memory block 600 may include active bits 602, 606, 608, or 610 that each represent a desired bit precision ("BP") for R and/or Q type messages in the LDPC decoder. For example, BP may be equal to M, a positive integer value. BP may have a maximum desired precision equal to L, a positive integer value. For example, for Q memory and for Q type messages, M may be equal to three and L may be equal to eight. For example, for R memory and for R type messages, M may be equal to one and L may be equal to six.

Active bits are the bits that are used to represent, read, and write the R and/or Q type messages stored respectively in the R and/or Q memories. The number of active bits represent the bit precision, BP, of the R and/or Q type messages. The bits that are not active may be masked or powered down so that they are not used, not read, and/or not written. As can be seen, message memory block 600 may have M active bits 602 and L−M masked bits 603. Message memory block 600 may have M+1 active bits 604 and L−(M+1) masked bits 605. Message memory block 600 may have M+2 active bits 606 and L−(M+2) masked bits 607. Message memory block 600 may have L−1 active bits 608 and one masked bit 609. Message memory block 600 may have L active bits 610. The number of active bits may be controlled by a register, ACTIVE_BITS. This register may be implemented inside or outside of message memory block 600 and controlled by, for example, monitoring logic circuitry, as discussed below.

The condition of the communications channel (e.g., channel 110 of FIG. 1) and/or the device using the LDPC decoder may be monitored (e.g., by monitoring logic circuitry, discussed below). The monitoring may determine the bit precision, BP, of R and/or Q type messages. For example, when the signal-to-noise ratio (SNR) associated with the communications channel is high, as described above, indicating that the channel condition is good, the bit precision of the R and/or Q type messages (e.g., controlled by the ACTIVE_BITS register) may be set at a low number. When the SNR associated with the communications channel is low, as described above, indicating that the channel condition is bad, the precision of the R and/or Q type messages (e.g., controlled by the ACTIVE_BITS register) may be set at a high number. The control of STPS select input 513 of multiplexer 511 by monitoring logic circuitry will be discussed in greater detail, below, with reference to FIG. 7.

Memory access line 620 may be used to read and write R and/or Q messages to and from message memory block 600. In some embodiments, memory access line 620 may be used to read or write only the active bits associated with each of these R and/or Q messages.

When the condition of the communications channel is good, setting the precision of R and/or Q type messages to a lower number will substantially reduce power-consumption in the LDPC decoder. In particular, a reduced precision for R and/or Q type messages may reduce the amount of processing that is necessary in the LDPC decoder, thereby substantially reducing decoder power consumption.

Figure 7:
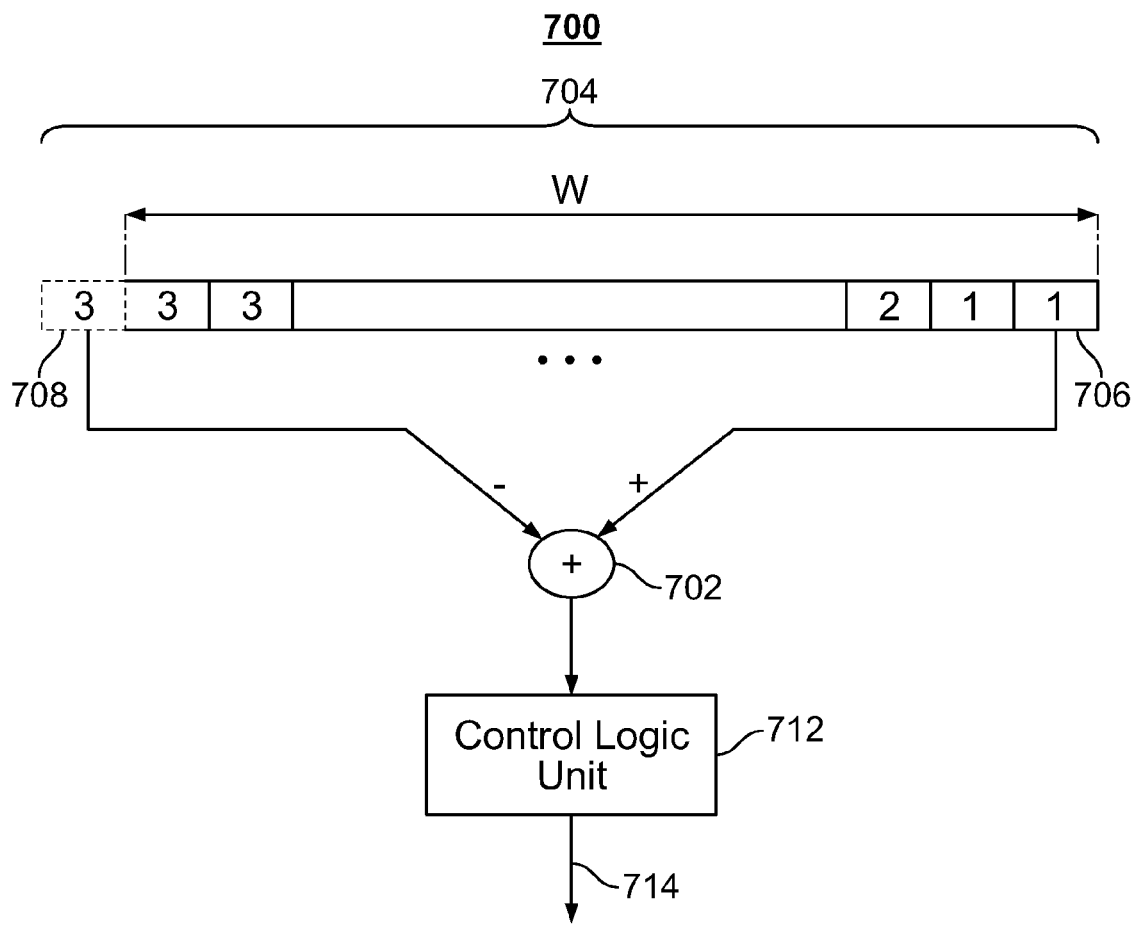
FIG. 7 shows monitoring logic circuitry that may be used for monitoring decoder statistics in accordance with some embodiments.

FIG. 7 shows monitoring logic circuitry 700 that may be used for monitoring decoder statistics in accordance with some embodiments. Control logic circuitry 700 includes memory 704, newest metric value 706, oldest metric value 708, control logic unit 712, and output signal 714. Control logic circuitry 700 may also include adder 702. As will be discussed below, newest metric value 706 and oldest metric value 708 may be, for example, statistics or numbers related to the condition of the communications channel or the condition of the device. Control logic circuitry 700 may be located inside or outside of a LDPC decoder (e.g., layered LDPC decoder 500 of FIG. 5).

Memory 704 stores a window of W numbers. By way of example, memory 704 may be used to store the monitored number of bit errors corrected by an LDPC decoder in the past. This may be a first metric. In particular, the number of bits corrected by the decoder ("input errors") in received vectors may be determined by comparing each of the past W received vectors to each corresponding output codewords from the LDPC decoder (when the decoder converged) and may be stored in memory 704. A large number of past errors could indicate that the condition of the communications channel (e.g., channel 110 of FIG. 1) is bad (e.g., is associated with a low SNR). A small number of past errors could indicate that the condition of the communications channel (e.g., channel 110 of FIG. 1) is good (e.g., is associated with a high SNR). A determination that the number of past errors is small may be made based on a comparison of the number with a threshold (discussed below) or based on the number of received vectors that require, e.g., less than 1.5 or 2 iterations of the decoder, per circulant. The number of past errors being small may be determined by the code rate of the LDPC code. A determination that the number of past errors is large may be made based on a comparison of the number with a threshold (discussed below) or based on the number of received vectors that require, e.g., more than 1.5 or 2 iterations of the decoder, per circulant.

In some embodiments, memory 704 may be used to store the monitored past W numbers of iterations the LDPC decoder needed to converge for the past W codewords (equivalently the past W blocks or sectors). This may be a second metric. Using the second metric, if the maximum number of possible iterations for the decoder is denoted maxIterNum, each number stored in memory 704 may be at most $\log_2$(maxIterNum) bits long. A large number of past iterations indicates that the condition of the communications channel is bad (e.g., is associated with a low SNR). A small number of past iterations indicates that the condition of the communications channel is good (e.g., is associated with a high SNR).

In some embodiments, memory 704 may be used to store W/S numbers. Each number may correspond to iterations of the LDPC decoder needed to converge for the past S codewords (equivalently blocks or sectors). Using this approach, each number stored may be at most $\log_2$(S×maxIterNum) bits long and the size of memory necessary to store history information may be reduced. In general S is set to a value that is less than or equal to W and both the values of S and W may be design choices. For example, if the values of S and W are both small, monitoring logic circuitry 700 may be very sensitive to changes in SNR. If the values of S is large and the value of W is set equal to the value of S, monitoring logic circuitry 700 may be less sensitive to changes in SNR. This assumes that correlation between blocks (or sectors) exists over the larger window, W.

In general, any metric related to the condition of the communications channel or the condition of the device, in which the decoder is implemented, may be monitored by monitoring circuitry. For example, the condition of the device in which the decoder is implemented may be correlated with measurements including the number of times the device is used in various intervals of time, the number of times it performed an operation in various intervals of time, and/or the amount of processing it performed in various intervals of time. At least one of these measurements may be compared to one or more thresholds, each set at an appropriate value for the device in which the decoder is implemented. For example in the case when one threshold is used, if the measurement is above the threshold, then the condition of the device in which the decoder is implemented may be determined to be bad. If the measurement is below the threshold, then the condition of the device in which the decoder is implemented may be determined to be good. For example, on a flash memory device implementing a decoder, the number of times that a read operation is performed may be monitored and the condition of the flash memory device may be determined from this number.

Memory 704 may be used to store statistics or numbers related to the metric. These statistics or numbers are used to determine whether to enable or disable the low-power syndrome check, change the bit precision of R and/or Q type messages, and/or change the scale of R and/or Q type messages. A low number of uses of the device, a low number of times that it performed an operation, and/or a low amount of processing may indicate that the condition of the device, in which the decoder is implemented, is good. The low-power syndrome check may therefore be enabled, and/or the bit precision of R and/or Q type messages may therefore be made smaller. A high number of uses of the device, a high number of times that it performed an operation, and/or a high amount of processing may indicate that the condition of the device is bad. The low-power syndrome check may therefore be disabled, and/or the bit precision of R and/or Q type messages may therefore be made larger.

Adder 702 combines all of the numbers stored in memory 704. For example, adder 702 may add all of the W or W/S numbers stored in memory 704. Adder 702 may instead add newest metric value 706 to and may subtract oldest metric value 708 from the previously computed sum (which is initially set to zero). Newest metric value 706 may be the most recent number stored in memory 704 and oldest metric value 708 may be the number being removed from memory (e.g., the $(W+1)^{th}$ or $([W/S]+1)^{th}$ number). Adder 702 outputs its result ("Sum") to control logic unit 712. In some embodiments, adder 702 may be supplemented by circuitry which divides the result of adder 702 by the amount of numbers stored in memory 704 (e.g. W or W/S) to produce a moving average ("MA"). The MA may also be output to control logic unit 712.

Control logic unit 712 compares the Sum value and/or the MA value it receives from adder 702 to a threshold. Control logic unit 712 may instead compare the Sum value and/or the MA value it receives from adder 702 to multiple thresholds. Control unit 712 drives output signal 714 based on the comparison(s).

In some embodiments, control logic unit 712 may compare the Sum value and/or the MA value to a threshold, THRESH. THRESH may be set appropriately for the metric from which the Sum value and/or the MA value are generated. For the first metric, THRESH may be set to set to a small number of errors, dependent on, e.g., the rate of the LDPC code. For the second metric, THRESH may be set equal to W×1.5 (or W×2.0) and compared to an MA value. This may require that 1.5 (or 2.0) iterations per decoded codeword are required on average to meet the threshold.

If Sum and/or MA are greater than the threshold, control logic unit 712 may drive output signal 714 to a logic "0" value. Output signal 714 may then set STPS select input 513 of multiplexer 511 of FIG. 5 to zero, disabling the low-power syndrome check discussed above. If instead Sum or MA are less than or equal to the threshold, control logic unit 712 may drive output signal 714 to a logic "1" value. Output signal 714 may then set STPS select input 513 of multiplexer 511 of FIG. 5 to one, enabling the low-power syndrome check discussed above.

In some embodiments, control logic unit 712 may compare the Sum value and/or the MA value to a set of thresholds for bit precision, each labeled ThrBPj, where j is a negative or a positive number. For example, ThrBP−1 corresponds to a 1-bit decrement, ThrBP−2 corresponds to a 2-bit decrement, ThrBP−(L−M+1) corresponds to a L−M+1 bit decrement, ThrBP1 corresponds to a 1-bit increment, ThrBP2 corresponds to a 2-bit increment, and ThrBP(L−M+1) corresponds to a L−M+1 bit increment. These thresholds may be used to control the bit precision of the messages (e.g., Q and/or R type messages) in, e.g., message memory block 600 of FIG. 6. In particular, the value of Sum or MA may be used to increase or decrease the number of active bits used for the messages stored in the message memory. The current bit precision ("BP") for the memory block may be set at M bits (i.e., BP=M bits). The Sum value and/or MA value may be computed for W=S codewords (sectors or blocks). W may be set equal to S so that, e.g., there is no overlap between windows, and to be able to follow the precision of R and/or Q type messages for each window independently.

The Sum value and/or MA may then be compared to the thresholds, ThrBPj, to determine the appropriate value for BP of R and/or Q type messages. Using the MA value:
If MA≧ThrBP−1 and MA<ThrBP1, BP may not be changed;
if MA≧ThrBP1 and MA<ThrBP2, BP may be incremented by 1 (BP:=BP+1);
if MA≧ThrBP2 and MA<ThrBP3, BP may be incremented by 2 (BP:=BP+2);
if MA≧ThrBP−2 and MA<ThrBP−1, BP may be decremented by 1 (BP:=BP−1);
if MA≧ThrBP−3 and MA<ThrBP−2, BP may be decremented by 2 (BP:=BP−2).
In general, using the MA value,
If MA≧ThrBP−1 and MA<ThrBP1, BP may not be changed;
for j>0: If MA≧ThrBPj and MA<ThrBP(j+1), BP may be set so that BP:=BP+j;
for j<0: If MA≧ThrBP(j−1) and MA<ThrBPj, BP may be set so that BP:=BP+j (decrement by |j|). If a Sum value is used, instead of a MA value, then MA in the above inequalities may be replaced by Sum.

The set of thresholds, ThrBPj, may be set appropriately for the metric from which the Sum value and/or the MA value are generated. For example, for the first metric, using the MA value, the ThrBP1 may be set to be a medium number of errors dependent on the code rate of the LDPC code.

For the second metric, using the MA value, the ThrBPj may be set as, e.g.,
ThrBP1=W×maxIterNum/4 (the threshold is set at ¼ of the maximum number of possible iterations per codeword on average), or
ThrBP2=W×maxIterNum/3 (the threshold is set at ⅓ of the maximum number of possible iterations per codeword on average), or
ThrBP3=W×maxIterNum×⅔ (the threshold is set at ⅔ of the maximum number of possible iterations per codeword on average), or
ThrBP−1=W×maxIterNum/6 (the threshold is set at ⅙ of the maximum number of possible iterations per codeword on average), or
ThrBP−2=W×maxIterNum/8 (the threshold is set at ⅛ of the maximum number of possible iterations per codeword on average), or
ThrBP−3=W×maxIterNum/12 (the threshold is set at 1/12 of the maximum number of possible iterations per codeword on average).

In some embodiments, the scale factor, ScaleR and/or ScaleQ, described above, may be used to scale R and/or Q type messages, respectively. Control logic unit 712 may compare the Sum value and/or the MA value to a set of thresholds for scale factor, each labeled ThrScalej, where j is a negative or a positive number. For example, ThrScale−1 corresponds to a 1×ΔScale increment, ThrScale1 corresponds to a 1×ΔScale decrement, and in general, ThrScalej corresponds to a j×ΔScale change in ScaleR or ScaleQ. These thresholds may be used to control the value of Scale in the computation of the messages (e.g., Q and/or R type messages) described above. In particular, the value of Sum or MA may be used to determine the value of the scale factor of R and/or Q type messages by ΔScale (e.g., ScaleR:=ScaleR+ΔScale) in a decoder (e.g., a min-sum LDPC decoder). There may be one or more scale factors. For example, for irregular LDPC codes, there may be a vector of scale factors, where each entry in the vector corresponds to a scale factor for a particular column weight (cw). In addition, a second vector of scale factors may be needed for row-weights. The thresholds for the scale factor and the values of ΔScale may be the only parameters that need to be optimized.

Figure 8:
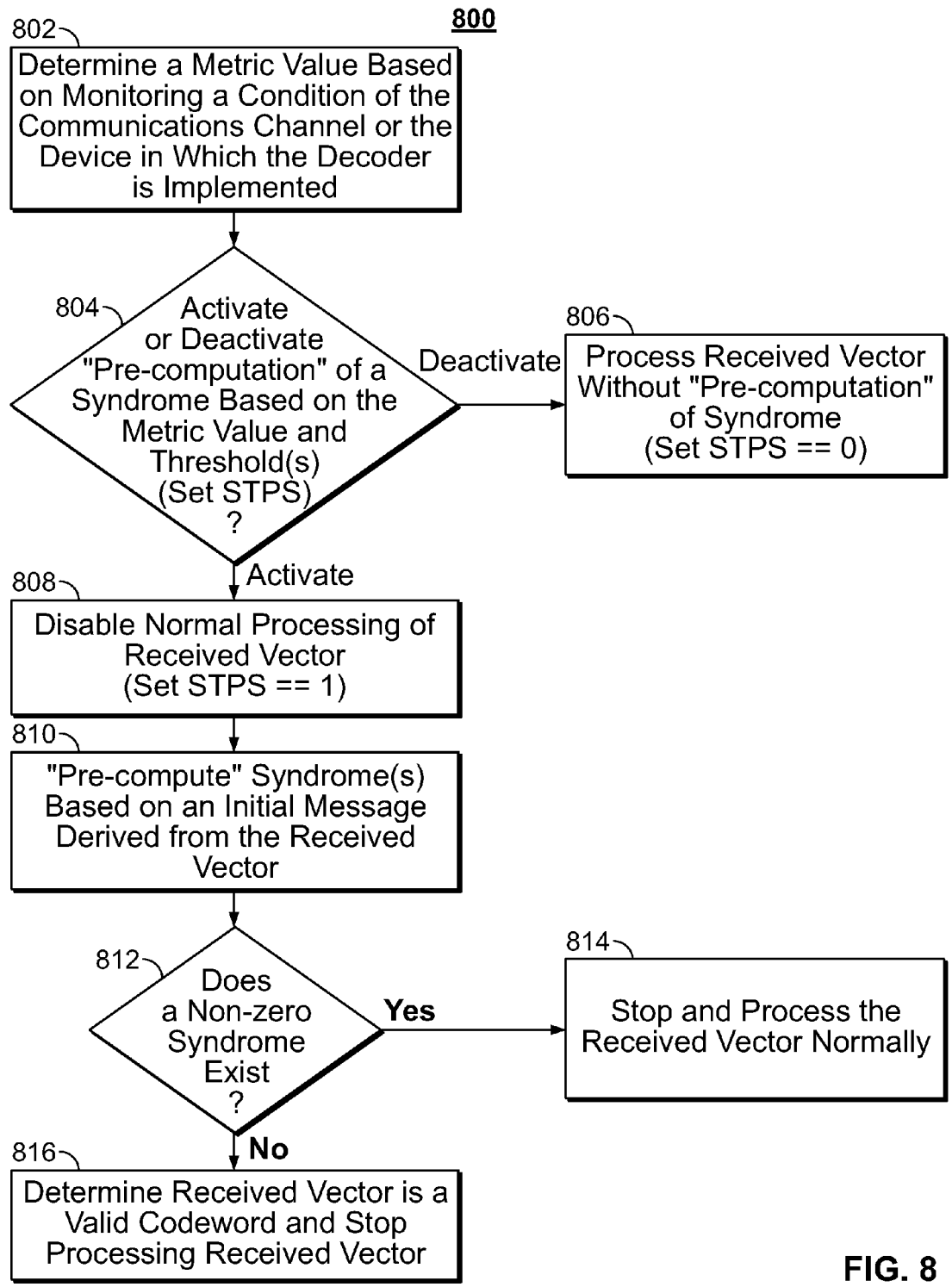
FIG. 8 shows a flowchart of a process for a low-power syndrome check used with LDPC decoders in accordance with some embodiments.

FIG. 8 shows a flowchart of process 800 for a low-power syndrome check used with LDPC decoders in accordance with some embodiments. Process 800 includes 802, 804, 806, 808, 810, 812, and 814, and 816. Process 800 may be executed by a decoder (e.g., LDPC decoder 116 of FIG. 1 or layered LDPC decoder 500 of FIG. 5) to substantially reduce power-consumption.

At 802, metric 1, the number of past errors corrected (input errors) in a received vector (e.g., received vector 114 of FIG. 1), metric 2, the number of past iterations, and/or any other metric is monitored by monitoring circuitry, e.g., monitoring logic circuitry 700 of FIG. 7. In general, at 802, the condition of the communications channel (e.g., channel 110 of FIG. 1) and/or the condition of the device in which the decoder is implemented may be monitored based on a particular metric. A metric value that is correlated to the condition is computed based on this monitoring. For example, as discussed above, a MA value, a Sum value, and/or any other value may be computed based on the monitoring that is done and 804 may be executed. The monitoring may be done by control logic circuitry (e.g., control logic circuitry 700 of FIG. 7) or any monitoring circuitry as described with reference to FIG. 7.

At 804, it may be determined whether the "pre-computation" of the syndrome (i.e., the low power syndrome check, as described above) should be activated or deactivated. For example, control logic circuitry (e.g., control logic unit 712 of FIG. 7) may make this determination. The determination may be made, as described with reference to FIG. 7. In particular the determination may be made based on, the MA value, the Sum value, or any other metric value computed at 802 and based on a threshold, e.g., THRESH. For example, a Sum, MA, or other computed metric value less than or equal to the threshold indicates that the condition of the communications channel (e.g., channel 110 of FIG. 1) is good and/or that the condition of the device in which the decoder is implemented is good. Otherwise, the Sum, MA, or other computed metric value may indicate that the condition is bad. If Sum, MA, and/or any other computed metric value are greater than the threshold, the low-power syndrome check, discussed, above is disabled and 806 may be executed. If instead, Sum, MA, and/or any other computed metric value are less than or equal to the threshold, the low-power syndrome check, discussed above, is enabled and 808 may be executed.

At 806, the decoder processes the received vector without "pre-computation" of the syndrome (i.e., the low power syndrome check, as described above). In addition, STPS select input 513 of multiplexer 511 of FIG. 5 is set to zero.

At 808, normal processing of the received vector by the decoder is disabled. As discussed above, this may allow for a substantial reduction in power-consumption in the decoder. In addition, STPS select input 513 of multiplexer 511 of FIG. 5 is set to one. Next, 810 may be executed.

At 810, syndromes may be determined based on information from the received vector. In particular, an initial LLR message, derived from the received vector (e.g., received vector 114 of FIG. 1), is computed or received by the decoder (e.g., LDPC decoder 116 of FIG. 1 or layered LDPC decoder 500 of FIG. 5). The sign of each value in the initial LLR message may be computed. For example, the sign may be equal to zero if the $i^{th}$ value in the initial LLR message indicates that the probability of $i^{th}$ bit in the received vector is "0" is greater than the probability of a bit being "1." For example, the sign may be equal to one if the $i^{th}$ value in the initial LLR message indicates that the probability of $i^{th}$ bit in the received vector is "1" is greater than the probability of a bit being "0." Syndromes may be computed as described above, (by, e.g., syndrome computation unit 517 of FIG. 5) based on the sign of each value in the initial LLR message that is received and the parity check matrix (e.g., parity check matrix 212 of FIG. 2) associated with the LDPC code being applied. After syndromes are computed based on the initial message, 812 may be executed.

At 812, it is determined whether a non-zero syndrome exists in the syndromes computed at 810. For example if any one syndrome is equal to a non-zero number, it may be determined that the received vector is an invalid codeword and 814 may be executed. If, however, it is determined that all of the syndromes calculated are zero, then 816 is executed. These determinations are made, e.g., by the convergence logic in the decoder.

At 814, the received vector is processed further (using, e.g., normal decoder processing, described above or equivalently, full-blown processing). The processing may be done by the decoder (e.g., LDPC decoder 116 of FIG. 1 or layered LDPC decoder 500 of FIG. 5).

At 816, it is determined that a valid codeword is found. The received vector is not processed any further by the decoder. The decoder may then begin to process the next received vector. As explained above, because the low-power syndrome check is activated when the condition of the communications channel and/or device is good, the low-power syndrome check may substantially reduce power-consumption in the decoder.

It should be understood that the above steps of process 800 may be executed or performed in any order or sequence not limited to the order and sequence shown and described in the figure. Also, some of the above steps of process 800 may be executed or performed substantially simultaneously where appropriate or in parallel to reduce latency and processing times. Some or all of the above steps of process 800 may be executed by low-power circuitry and/or by monitoring circuitry used by a decoder.

Figure 9:
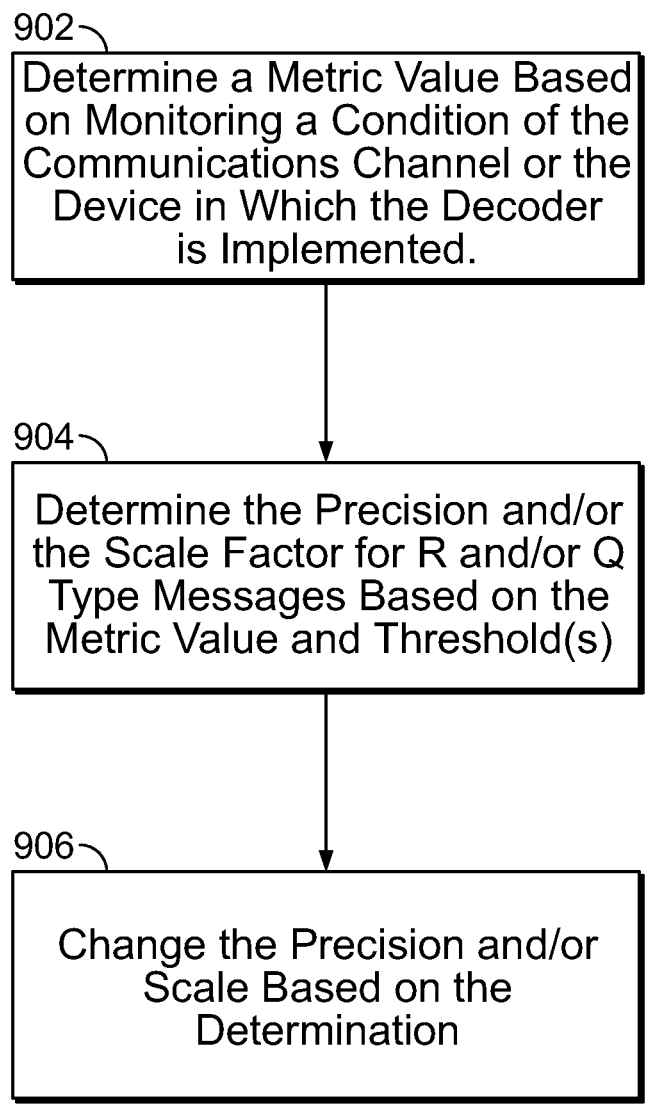
FIG. 9 shows a flowchart of a process for a changing the precision or scale of messages to reduce power consumption in an LDPC decoder in accordance with some embodiments.

FIG. 9 shows a flowchart of process 900 for a changing the precision or scale of messages to reduce power consumption in an LDPC decoder in accordance with some embodiments. Process 900 includes 902, 904, and 906.

At 902, metric 1, the number of past errors corrected (input errors) in a received vector (e.g., received vector 114 of FIG. 1), metric 2, the number of past iterations, and/or any other metric is monitored by monitoring circuitry, e.g., monitoring logic circuitry 700 of FIG. 7. In general, at 902, the condition of the communications channel (e.g., channel 110 of FIG. 1) and/or the condition of the device in which the decoder is implemented may be monitored based on a particular metric. A metric value that is correlated to the condition is computed based on this monitoring. As discussed above, a MA value, a Sum value, and/or any other value may be computed based on the monitoring that is done and 904 may be executed. For example, the monitoring may be done by control logic circuitry (e.g., control logic circuitry 700 of FIG. 7) or any monitoring circuitry as described with reference to FIG. 7.

At 904, the appropriate bit precision, BP, and/or scale factor, Scale, of R type and/or Q type messages is determined based on the monitoring at 902. For example, control logic circuitry (e.g., control logic unit 712 of FIG. 7) may make this determination. The determination may be made, as described with reference to FIG. 7. The MA value and/or the Sum value computed at 902 may be compared to one or multiple threshold values to determine whether and in what way to change the bit precision and/or the scale of R and Q type messages used in the decoder. For example, the determination to change the bit precision, BP, of R and/or Q type messages may be made based on the MA value computed at 902 and based on the thresholds ThrBPj described above. As another example, the determination to change the scale factor of R and/or Q type messages may be made based on the MA value computed at 902 and based on the thresholds ThrScalej described above.

At 906, the bit precision, BP, and/or scale, ScaleR and/or ScaleQ, associated with R type and/or Q type messages may be changed and set according to the determination made at 904. For example, using the MA value, if MA≧ThrBP−1 and MA<ThrBP1, then BP may not be changed, for an integer value of j>0: If MA≧ThrBPj and MA<ThrBP(j+1), BP may be set so that BP:=BP+j, and for j<0: If MA≧ThrBP(j−1) and MA<ThrBPj, BP may be set so that BP:=BP+j, (decrement by |j|). If a Sum value is used instead of the MA value, "MA" in the above inequalities may be replaced by "Sum". The BP value may be supplied via a register that sets the number of active bits equal to BP to the memory where R and/or Q type messages are stored. As another example, the value of Sum or MA may be used to increase or decrease the value of a scale factor by ΔScale (e.g., ScaleQ:=ScaleQ+ΔScale) of R and/or Q type messages in a decoder (e.g., a min-sum implementation of a LDPC decoder). The change in the scale factor may be based on the thresholds, ThrScalej. For example, ThrScalej corresponds to a j×ΔScale change in the scale factor. In addition, there may be one or more scale factors, for each message, and the Sum or MA values may be used in changing these scale factors as well. Control logic circuitry (e.g., control logic unit 712 of FIG. 7) may be used to make or signal any of these changes.

The amount of decoder processing necessary to process messages of a lower bit precision may be substantially reduced. Because of this substantial reduction in processing from the messages of a lower bit precision, a substantial reduction in power-consumption in the decoder may be realized.

It should be understood that the above steps of process 900 may be executed or performed in any order or sequence not limited to the order and sequence shown and described in the figure. Also, some of the above steps of process 900 may be executed or performed substantially simultaneously where appropriate or in parallel to reduce latency and processing times. Some or all of the above steps of process 900 may be executed by low-power circuitry and/or by monitoring circuitry used by a decoder.

The foregoing description of exemplary embodiments of the present disclosure provides illustration and description, but is not intended to be exhaustive or to limit the disclosure to the precise form disclosed. Modifications and variations are possible in light of the above teachings or may be acquired from practice of what is disclosed herein. For example, while a LDPC decoder is described with relation to FIGS. 1-9, this element may be replaced by any type of decoder (e.g., the LDPC decoder could instead or more particularly be any type of layered decoder, any type of flooding decoder, or any other type of decoder). The decoder may also be any variant of these decoders (e.g., a hard decoder, a bit-flipping decoder, a soft decoder, or any other variant of a decoder). Additionally, the decoder may make use of either hard information or soft information to decode incoming information. While certain elements of FIG. 5 have been described as implemented in layered LDPC decoder 500 of FIG. 5, these elements may be implemented in any type of variant of a decoder. For example, these elements may be implemented in an iterative soft decoder, a flooding decoder, a hard decoder, a bit-flipping decoder, or as stand-alone elements in any device. In addition, while certain components of this disclosure have been described as implemented in hardware and others in software, other configurations may be possible.

What is claimed is:

1. A method of decoding a vector, using a decoder inside a device, the method comprising:
   determining a metric value based on a condition of at least one of a channel and the device using monitoring circuitry;
   comparing the metric value with at least one threshold using the monitoring circuitry;
   based on the comparison:
      disabling normal processing of the vector;
      pre-computing a syndrome based on an initial message derived from the vector;
      determining if the vector is valid based on the pre-computed syndrome.

2. The method of claim 1, wherein the metric value is determined based on at least one of a number of errors previously corrected by the decoder and a number of iterations for the decoder to converge.

3. The method of claim 1, wherein comparing the metric value with at least one threshold comprises determining if the metric value is less than or equal to the at least one threshold.

4. The method of claim 1, wherein determining if the vector is valid based on the pre-computed syndrome comprises determining that a non-zero syndrome exists.

5. The method of claim 1, wherein the decoder is a low-density parity check (LDPC) decoder.

6. The method of claim 1, wherein the condition of the channel is good if the signal-to-noise (SNR) associated with the communications channel is above a first value and wherein the condition of the device is good if the device is used a number of times below a second value.

7. The method of claim 1, wherein the metric value is correlated to the condition of at least one of the channel and the device.

8. The method of claim 1, wherein the threshold is used to determine whether the condition of the communications channel is good.

9. The method of claim 1, wherein the threshold is used to determine whether the condition of the device is good.

10. The method of claim 1, wherein based on the comparison, re-enabling normal processing of the vector.

11. The method of claim 1, wherein based on the comparison, the circuitry is configured to re-enable normal processing of the vector.

12. A device comprising a decoder for decoding a vector, the device comprising:
   monitoring circuitry configured to:
      determine a metric value based on a condition of at least one of a channel and the device;
      compare the metric value with at least one threshold; and
   based on the comparison, circuitry configured to:
      disable normal processing of the vector;
      pre-compute a syndrome based on an initial message derived from the vector, using a syndrome computation unit;
      determine if the vector is valid based on the pre-computed syndrome.

13. The device of claim 12, wherein the metric value is determined based on at least one of a number of errors previously corrected by the decoder and a number of iterations necessary for the decoder to converge.

14. The device of claim 12, wherein the monitoring circuitry is further configured to determine if the metric value is less than or equal to the at least one threshold.

15. The device of claim 12, wherein the circuitry is further configured to determine that a non-zero syndrome exists.

16. The device of claim 12, wherein the decoder is a low-density parity check (LDPC) decoder and wherein the device is one of a flash memory storage, a mobile device, a phone, and a satellite.

17. The device of claim 12, wherein the condition of the communications channel is good if the signal-to-noise (SNR) associated with the channel is above a first value and wherein the condition of the device is good if the device is used a number of times below a second value.

18. The device of claim 12, wherein the metric value is correlated to the condition of at least one of the channel and the device.

19. The device of claim 12, wherein the threshold is used to determine whether the condition of the communications channel is good.

20. The device of claim 12, wherein the threshold is used to determine whether the condition of the device is good.

* * * * *